United States Patent [19]

Okudaira et al.

[11] Patent Number: 5,705,029
[45] Date of Patent: Jan. 6, 1998

[54] DRY ETCHING METHOD

[75] Inventors: Sadayuki Okudaira, Ome; Kazunori Tsujimoto, Higashiyamato; Shinichi Tachi, Sayama, all of Japan

[73] Assignee: Hitachi, Ltd., Tokyo, Japan

[21] Appl. No.: 457,748

[22] Filed: Jun. 1, 1995

Related U.S. Application Data

[63] Continuation of Ser. No. 6,942, Jan. 21, 1993, abandoned, which is a continuation of Ser. No. 503,124, Apr. 2, 1990, Pat. No. 5,354,416, which is a continuation of Ser. No. 302,123, Jan. 26, 1989, abandoned, which is a continuation of Ser. No. 84,806, Aug. 13, 1987, abandoned.

[30] Foreign Application Priority Data

Sep. 5, 1986 [JP] Japan .................. 61-207832
Apr. 24, 1987 [JP] Japan .................. 62-99739

[51] Int. Cl.$^6$ .................................................. H01L 21/00
[52] U.S. Cl. ................ 156/643.1; 156/646.1; 156/662.1
[58] Field of Search ............ 156/643.1, 646.1, 156/662.1; 216/67, 69, 70, 71

[56] References Cited

U.S. PATENT DOCUMENTS

| | | | |
|---|---|---|---|
| 4,367,114 | 1/1983 | Steinberg et al. | 156/643 X |
| 4,383,885 | 5/1983 | Maydan et al. | 156/643 |
| 4,468,285 | 8/1984 | Bayman et al. | 156/643.1 |
| 4,490,209 | 12/1984 | Hartman . | |
| 4,565,601 | 1/1986 | Kakehi et al. | 156/643 |
| 4,615,755 | 10/1986 | Tracy et al. | 156/643 X |

FOREIGN PATENT DOCUMENTS

| | | |
|---|---|---|
| 158627 | 8/1985 | Japan . |
| 48924 | 3/1986 | Japan . |

Primary Examiner—Thi Dang
Attorney, Agent, or Firm—Antonelli, Terry, Stout & Kraus, LLP.

[57] ABSTRACT

Etching of an article is carried out by maintaining the article at a temperature at which the vapor pressure of etching gas molecules becomes equal to or higher than the pressure of etching gas and the vapor pressure of neutral radicals contained in a plasma becomes equal to or lower than the pressure of an etching gas. An etching pattern with a substantially vertical side profile and extremely small in dimensional shift from the mask can be formed at high precision.

8 Claims, 3 Drawing Sheets

DRY ETCHING METHOD

This application is a continuation of application Ser. No. 08/006,942, filed Jan. 21, 1993, now abandoned which is a continuation of application Ser. No. 07/503,124, filed Apr. 2, 1990, now U.S. Pat. No. 5,354,416 which is a continuation of application Ser. No. 07/302,123, filed Jan. 26, 1989, now abandoned, which is a continuation of application Ser. No. 084,806, filed Aug. 13, 1987 now abandoned.

BACKGROUND OF THE INVENTION

This invention relates to a low-temperature dry etching method. More particularly, it relates to a low-temperature dry etching method which is suited for high-precision dry etching and in which etching is carried out by controlling the surface temperature of the article to be etched.

According to the conventional dry etching methods, in order to accomplish vertical etching with minimized side etch, it has been practiced to form a protective film on the side wall of the etched pattern to prevent side etch, as for instance described in Japanese Patent Application Laid-Open (Kokai) No. 126835/85, thereby to improve the etching precision. Also, as means for adsorbing etching gas on the article surface for strengthening so-called ion-assisted etching in which etching is carried out by having neutral particles adsorbed on the wafer surface and applying ions thereto, it has been practiced to regulate the article surface temperature so that the vapor pressure of the reaction product in the course of etching would become 1/10 of the vapor pressure at room temperature and to carry out etching at a temperature below said article surface temperature to thereby increase the etching speed, as for instance described in Japanese Patent Application Laid-Open (Kokai) No. 158627/85.

Among said prior art techniques, the technique for vertical etching intended to prevent side etch by forming a protective film on the side wall has many problems due to the utilization of deposition of the reaction product or the polymer formed by etching gas. For example, according to this technique, the etching reaction rate is lowered in principle, necessitating much time for the etching. Also, since the deposition film is formed not only on the side face of the wafer but also everywhere on the inner wall of the apparatus, such film would become a source of filthiness as it comes off to contaminate the wafer. Further, the film deposited on the pattern side wall must be removed after the formation of pattern, but such film removal is actually quite troublesome. Thus, this technique could hardly be applied to practical use in the production of semiconductor devices because of too low throughput and high level of defectiveness due to alien matter deposited on the wafer surface.

The idea of cooling the wafer for promoting the effect of ion assistance is merely envisaged to have the reaction gas adsorbed on the article surface and no regard is given to the possible change of vapor pressure of the reaction product and etching gas according to the temperature, so that this technique also has the problems such as lowered etching speed due to low temperature.

SUMMARY OF THE INVENTION

The object of this invention is to solve said problems in the prior art dry etching techniques and to provide a dry etching method which is capable of forming a fine pattern with a substantially vertical side profile at very high precision without lowering the etching speed and also without forming any deposit of said reaction product or polymer of an etching gas which may become a source of contamination.

According to the present invention, in order to attain such object, etching of the article surface is carried out by maintaining said article surface at a temperature which would make the vapor pressure of etching gas molecules higher than the pressure of etching gas in the reactor and which also would make the difference between the vapor pressure of reaction product resulting from the plasma contact of said article surface and etching gas and the pressure of said etching gas smaller than a prescribed value. This makes it possible to accomplish etching with a substantially vertical side profile at high precision with a minimized or almost no dimensional shift.

Further, by using a gas containing no such elements as carbon, boron and silicon which tend to deposit in the course of etching, for example, by using $F_2$, $Cl_2$, $SF_6$ or $NF_3$ either singly or in combination as etching gas, it is possible to prevent the deposition of polymer formed by such gas or reaction product of said gas and article to be etched, thus realizing effective preclusion of the generation of defectives due to contamination.

DETAILED DESCRIPTION OF THE PREFERRED EMBODIMENTS

Figure 1:
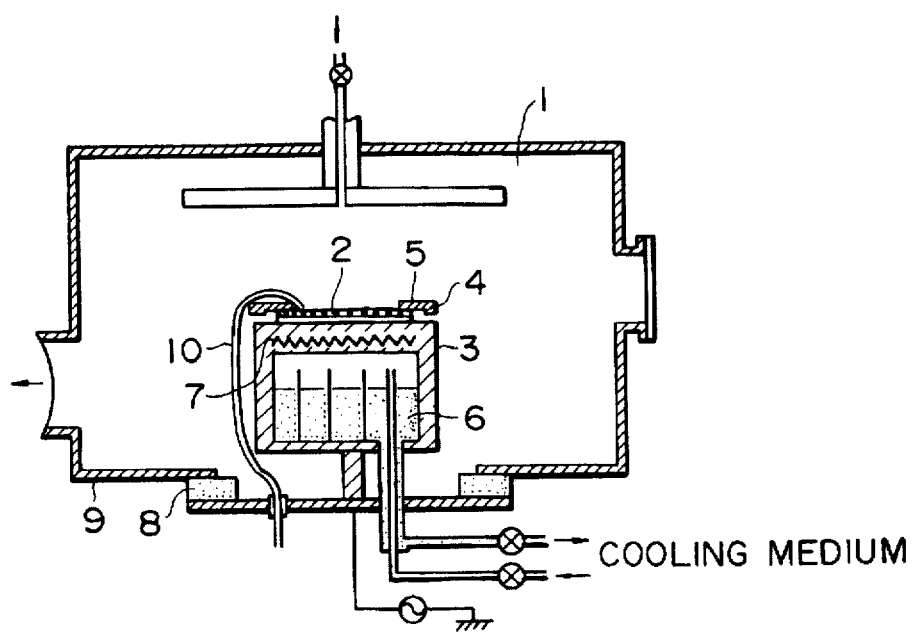
FIGS. 1 and 2 are schematic illustrations of a reactive ion etching apparatus and a microwave plasma etching apparatus, respectively, used in the practice of this invention.

Ions and neutral radicals exist in plasma used for etching. Ions can be controlled so that they will enter perpendicularly to the article surface, but it is difficult to give directional properties to the neutral radicals as they not only fly isotropically but also have no electric charges. Neutral radicals have a greater bearing on etching reaction speed than ions since there exist a larger amount of neutral radicals than ions in an ordinary plasma. Therefore, in ordinary plasma etching, because of the presence of a greater amount of reaction species whose direction of entrance to the article surface is isotropic such as neutral radicals, it often occurs that the portion under the mask is also etched to cause so-called undercut. Also, fluorine contained in plasma or oxygen often contained in a trace amount in residual gas might be reacted with the resist used for the mask to cause a diminution of the mask size, making it unable to perform etching true to the original size of the resist film to form a desired pattern.

Here, if it is possible to lower the reaction rate with neutral radicals or to lower the elimination rate of reaction product resulting from etching with neutral radicals, then it will become possible to form a pattern having a substantially vertical side profile by preventing isotropic etching with no need of forming a protective film on the pattern side wall. If the article surface temperature is lowered with due regard to the vapor pressure of reaction product for lowering the elimination rate of reaction product with neutral radicals, it is possible to lower both of the reaction rate with neutral radicals and the elimination rate of reaction product produced from the reaction with neutral radicals. Lowered temperature discourages the reaction of resist mask and can also minimize the dimensional diminution of the mask. Especially, the etching speed of resist film is sharply decreased by lowered temperature as such etching speed has very high temperature dependency.

Although it is desirable to suppress etching reaction by neutral radicals as described above, etching for patterning must be conducted. In ordinary plasma etching, there is used a flux of energy which enters perpendicularly to the article surface such as ions, light or laser, and the surface portion where such energy flux has entered is locally heated by the indicent energy. Even if the article is cooled generally, the extremely thin surface layer is heated to a high temperature, so that the temperature of the reaction area is substantially the same as when no cooling was made. In this case, if said etching gas is applied to the locally heated area or ions enter the etching gas adsorbed area, an ion-assisted reaction occurs to maintain the reaction rate and the reaction product elimination rate at the substantially same level as in the conventional practice. Thus, in the low-temperature etching method of this invention, effective use is made of an ion-assisted reaction or a light- or laser-assisted reaction. As described above, when a flux of energy such as ions is applied to the article surface almost vertically thereto, only the portion not covered with the mask is etched in the vertical direction and the portion under the mask is not etched, so that etching can be accomplished faithfully to the mask size.

In the present invention, the temperature of the article to be etched needs to be maintained at a level which would make the vapor pressure of etching gas molecules higher than the pressure of etching gas in the reactor in the actual practice of etching and which also would make the difference between the vapor pressure of reaction product produced by the reaction. of neutral radicals and article to be etched and the pressure of said etching gas smaller than a prescribed value.

At the temperature which makes the vapor pressure of etching gas molecules lower than the pressure of etching gas in the reactor at the time of etching, the etching gas molecules are adsorbed in a solid or liquid state on the article surface to prevent the progress of etching. Therefore, it is necessary to maintain the article temperature higher than said level so as to prevent said etching gas molecules from being adsorbed in a solid or liquid state on the article surface to retard the progress of etching.

Also, when the vapor pressure of reaction product of said neutral radicals and article to be etched is lower than the pressure of said etching gas, the reaction product formed on the side wall of the pattern won't be eliminated and as a result substantially no side etch takes place, so that a pattern with a substantially vertical side profile can be formed. Thus, when etching is carried out by maintaining the article temperature below the level at which the vapor pressure of said reaction product becomes equal to the pressure of said etching gas, side etch is prevented from taking place by said reaction product formed on the pattern side wall, thus allowing formation of a pattern with almost no dimensional shift from the mask.

Actually, said dimensional shift may not necessarily be zero but a slight dimensional shift is allowable. In the present invention, if the vapor pressure of said reaction product is lower than the pressure of etching gas, said dimensional shift becomes almost zero. However, even when etching is carried out at a temperature which would make the vapor pressure of said reaction product slightly higher than the pressure of etching gas, said dimensional shift can be kept within a sufficiently small range to obtain a practically well satisfactory result. For instance, as it was determined in a test, when the vapor pressure of said reaction product was $10^4$ times, $10^3$ times and $10^2$ times the pressure of etching gas, the dimensional shift (twice the side etch) from the mask size was 0.2 μm, 0.15 μm and 0.1 μm, respectively. These figures are far smaller than those obtained in the practice of dry etching by the conventional methods and guarantee the practical availability of said concept of this invention.

Thus, in the present invention, the article temperature is so selected that the vapor pressure of the reaction product of said article material and neutral radicals will not exceed $10^4$ times the pressure of etching gas. This temperature is of course variable depending on the type of etching gas used and the type of article to be etched. In case, for instance, a silicone article is etched by using fluoride gas as etching gas, the reaction product with neutral radicals is $SiF_4$, and when the pressure of etching gas is supposed to be 100 mTorr, the upper threshold temperatures at which the dimensional shift from the mask size becomes 0.1 μm and 0.2 μm are −130° C. and −95° C., respectively, and thus when the article temperature is set at −130° C. and −95° C., the dimensional shift becomes 0.1 μm or less and 0.2 μm or less, respectively. Needless to say, these temperatures −130° C. and −95° C. are the temperatures at which the vapor pressure of said reaction product becomes $10^4$ times and $10^2$ times, respectively, the pressure of etching gas.

The lower limit of article temperature in the present invention is the lowest temperature that does not cause adsorption of etching gas molecules on the article. It is apparent that this temperature varies depending on the type of etching gas used. For instance, in case a silicone article is etched by using $SF_6$ as etching gas, the lower limit temperature is −145° C., and when this etching is made by using $CF_4$ as etching gas, the lower limit temperature is −190° C.

In dry etching, the material to be etched is generally exposed to plasma. Or it may be exposed to ion beams or an energy flux such as light or laser at a location placed under a specific gas atmosphere. In either case, ions or highly reactive neutral species (neutral radicals) in the decomposed gas components are reacted with the article surface material to form a reaction product with high vapor pressure and such reaction product is released from the article surface to allow advancement of etching. The gas components with low reactivity are adsorbed on the article surface at a peculiar adsorption probability, but most of them return to the gas phase and are evacuated. In the case of a gas having components with high depositing disposition, for example a compound gas containing carbon C, boron B, silicon Si or other metal elements, such gas tends to remain adsorbed on the article surface and is hardly removable. Also, even the gas components with high reactivity with the article surface material won't be eliminated but will remain on the article surface if the vapor pressure of the reaction product is excessively low. Since said vapor pressure is dependent on the temperature of article surface, the sample temperature at the time of etching and gas species become the import factors.

In accordance with this invention, as opposed to the conventional method in which vertical etching has been conducted relying on the side wall deposition (side wall protective film) effect by using a gas with strong depositing disposition (such as $CCl_4$, $C_2F_6$, $C_3F_8$, $C_4F_8$, etc.), it is possible to realize vertical etching faithful to the mask dimensions even when using a gas with weak depositing disposition (such as $F_2$, $Cl_2$, $SF_6$, $NF_3$, etc.) which normally causes undercutting. Use of low temperature is helpful for greatly reducing the etching rate of the material with high temperature dependency for its etching rate such as photoresist, and this leads to a marked reduction of film loss of the mask, keeping the mask dimensions unchanged from those before etching. This has unnecessitated side wall deposition which has been a "necessary evil" in the prior art, and thus it has become unnecessary to take trouble for removing such deposit. In the prior art where said side wall deposition has been necessary, a dimensional diminution of the mask might be caused when removing the deposited film, but according to the present invention, since such deposition is unnecessitated, there is no fear of the mask suffering from a dimensional diminution in the etching operation. Also, since a gas with strong depositing disposition is not used, the degree of fouling of the inner walls of apparatus is markedly lessened. This reduces dusting in the apparatus, leading to an appreciable reduction of the occurrence of trouble or defects such as break or shortcircuiting of wiring of the elements.

EXAMPLE 1

Figure 2:
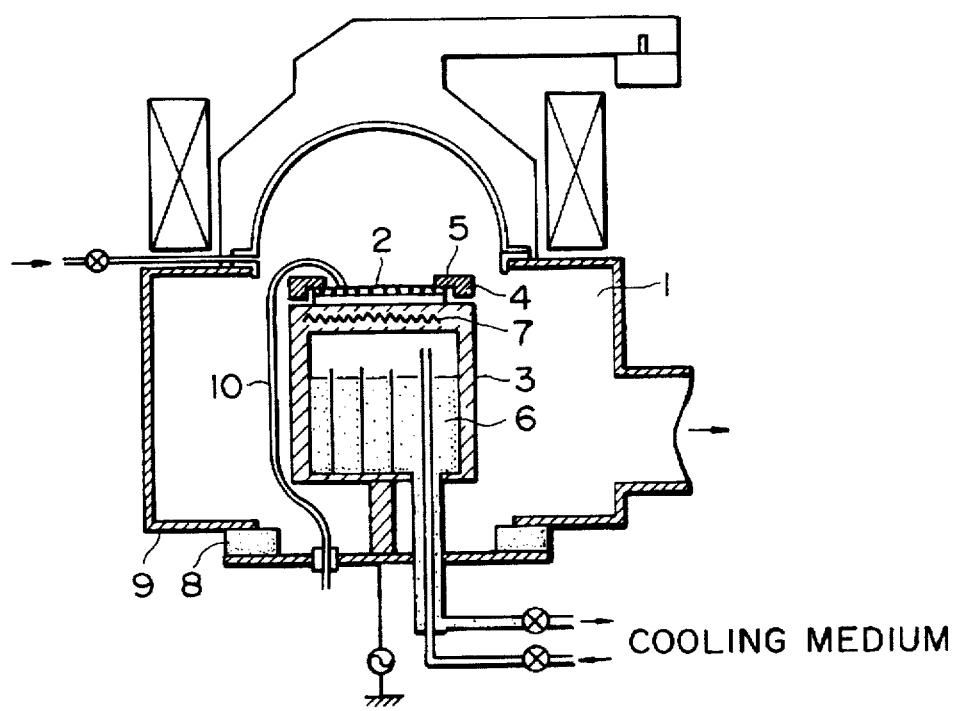

Either in the reactive ion etching (RIE) apparatus or the etching apparatus utilizing microwave plasma, the specimen stage in the reaction vessel is one of the important structural elements. FIG. 1 illustrates a specimen stage for low-temperature control provided in reaction vessel 1 of an RIE apparatus, in which a cooling medium such as liquid nitrogen can be used, and FIG. 2 illustrates a specimen stage for low-temperature control provided in reaction vessel 1 of an etching apparatus utilizing microwave plasma. In certain types of etching apparatus, the specimen stage is mounted on the upper side or sidewise of the reaction vessel, but in the apparatus of FIGS. 1 and 2, the specimen stage is disposed at the bottom of the reaction vessel.

The material to be etched (hereinafter referred to as wafer) 2 is fixed on a cooling stage 3 by a wafer holder 5 with a heat contact plate 4 held therebetween. Any suitable type of coolant is placed in said cooling stage 3, and if necessary a heater 7 may be incorporated. Said cooling stage is insulated from reaction vessel 9 of the apparatus by an electrical insulator 8 since a high voltage or a high frequency voltage is often applied to said cooling stage. The temperature of wafer 2 is subject to change according to the balance between influx rate of plasma or energy flux such as ions, laser, etc., and the amount of heat released through said heat contact plate 4. In the present embodiment of the invention, the wafer surface temperature was measured by a thermocouple 10. There are the ions which directly enter said thermocouple 10 and therefore the measured temperature may not be absolutely correct, but by this means the measurement with an ordinarily required precision is possible and the relative temperature change can be read.

Figure 3:
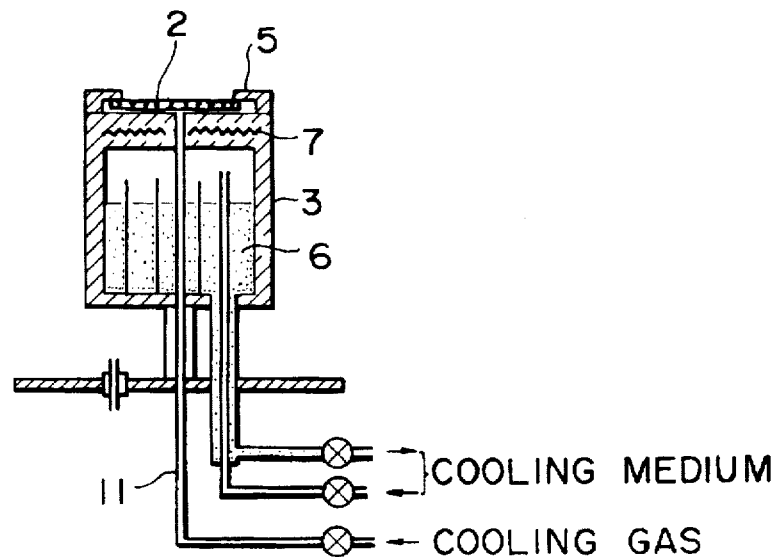
FIG. 3 is a schematic illustration showing another example of etching apparatus used in the practice of this invention.

Thermocouple 10 tends to become a source of impurity contamination in the actual processing apparatus, so that it is expedient to use a non-contact thermometer. In this embodiment of the invention, the temperature of wafer 2 was measured indirectly by selecting other location for the measurement of temperature. In this case, if the degree of heat contact by said heat contact plate 4 differs according to wafer, the fluctuation of temperature comes into question. As for the material of said heat contact plate 4, it is advised to use a laminate of well heat conductive metal foils or a type of grease capable of standing low temperatures. However, the reproducibility of heat contact is inevitably worsened as the treatment of wafer is repeated. FIG. 3 illustrates a specimen stage characterized in that a cooling gas pipe 11 is provided in a slight space created between wafer 2 and specimen stage 3 instead of providing said heat contact plate. It is an essential condition that said cooling gas won't be liquefied even if cooled to the coolant temperature. For example, He gas or from etching gases, one may select whichever has a higher vapor pressure. Generally, the higher the pressure of cooling gas, the greater is the effect, but an exceedingly high pressure may cause wafer 2 to be pushed out of its position on the specimen stage 3 even though held by wafer holder 5, so that it is advised to select said gas pressure from the range which is above about 1 Torr but below a pressure which makes the weight of said wafer holder 5 abnormally great. In case of using liquid nitrogen as coolant 6, in order to set the wafer temperature higher than said liquid nitrogen temperature, the pressure of said cooling gas (He gas or etching gas, whichever has a higher vapor pressure) is lowered, whereby the heat contact effect is reduced to allow a change to the higher temperature side. Thus, in the case of gas cooling, the heat contact efficiency can be controlled and the reproducibility is also excellent.

Figure 4:
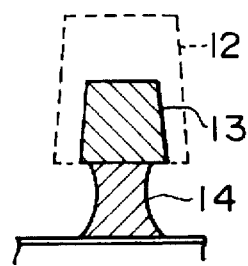
FIG. 4 shows a sectional shape of a pattern formed according to a conventional etching method.

The etching pattern obtained in this embodiment of the invention is described below. Although the pattern obtained by plasma etching alone is described here, there can be obtained the same effect by ion beam etching or by etching using light or laser. FIG. 4 illustrates a sectional shape of the etching pattern obtained by conventional reactive ion etching (RIE) using a high frequency voltage of 13.56 MHz or microwave plasma etching of 2.45 GHz. In either case, the specimen stage was water cooled (about 15° C.) and the wafer was simply placed on said specimen stage. The wafer temperature remained in the range of 50° to 130° C. throughout the etching operation. $SF_6$ and $CF_4$ were used as etching gas. In FIG. 4, broken line 12 indicates the shape of the resist mask before etching. After etching, the resist mask has diminished in both thickness and size as shown by solid line 13.

Poly Si and W were used as the article to be etched, and the same pattern configuration 14 was obtained in both cases. The pattern size indicated by 14 was more than 0.3 µm smaller than the size of the resist 13, and the resist size also became approximately 0.2 µm smaller than before etching. Etching was conducted under the following conditions: $SF_6$ gas pressure, 100 mTorr; overetching, about 20%; etching rate, 300 nm/min. It was confirmed that said dimensional shifts are further enlarged when the gas pressure is further raised or the overetching time is prolonged.

Now, the results obtained by the present invention will be described. Etching of W was carried out by using $SF_6$ gas by changing the gas pressure and temperature, that is, at −90° to −150° C. when the $SF_6$ gas pressure was 10 mTorr, at −80° to −140° C. when the gas pressure was 100 mTorr, and at −60° to 130° C. when the gas pressure was 1 mTorr. As a result, as shown by a sectional view in FIG. 5, the shape of resist film 13' after etching remained almost unchanged from the shape 12 before etching, and further a pattern of W film 14' could be obtained with no dimensional shift.

Figure 5:
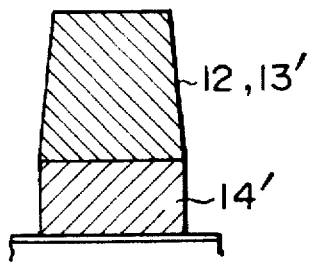
FIGS. 5 and 6 show the sectional shapes of the patterns formed according to the method of this invention.
Figure 6:
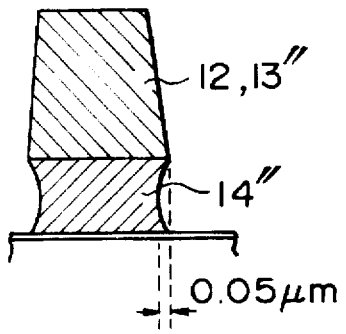
Figure 7:
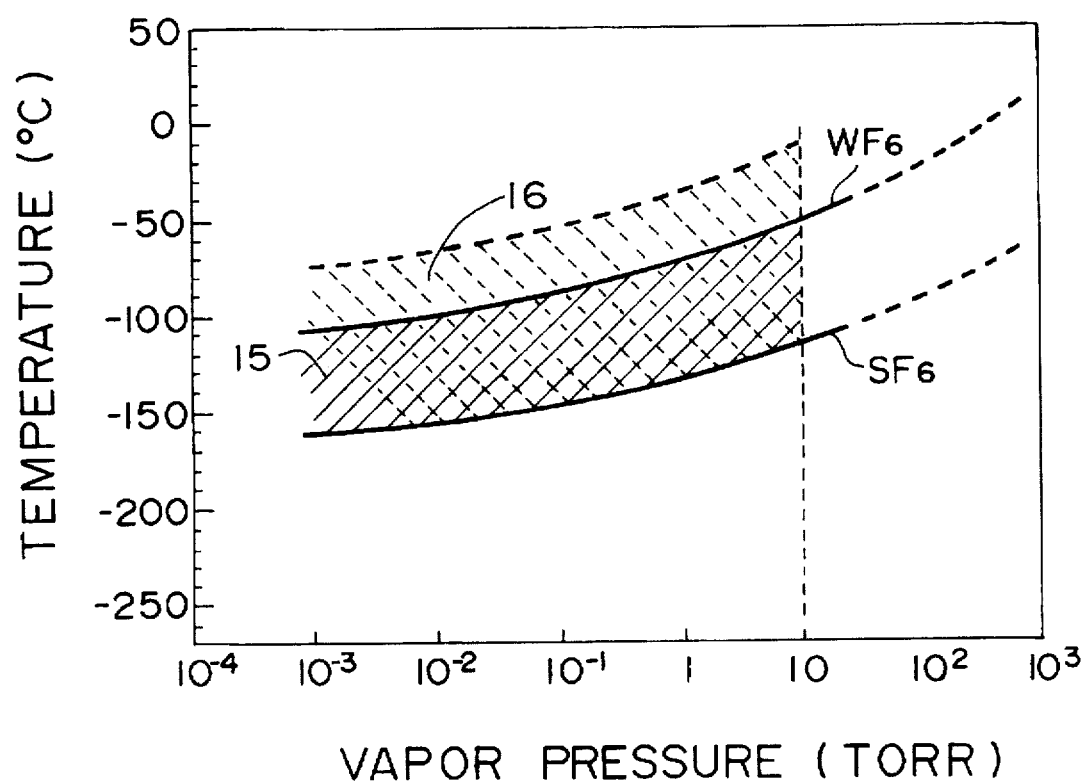
FIG. 7 is a graph of curves showing the relation between vapor pressure and temperature in use of $WF_6$ and $SF_6$.

Considering the results of the instant embodiment of the invention from the relation between vapor pressure of etching gas $SF_6$ and reaction product gas $WF_6$ and temperature shown in FIG. 7, it was found that vertical etching such as depicted in FIG. 5 could be attained in the temperature region 15 defined by two curves. Here, in order to examine the range where the etching gas pressure was increased, it was tried to reduce the electrode interval in the RIE apparatus shown in FIG. 1. It was found that this enabled discharge up to around 10 Torr. Actually, there are few cases where dry etching is carried out with a gas pressure above 10 Torr, so that in the case of W etching with $SF_6$ gas, the upper limit of the temperature region 15 is –50° C. when the gas pressure is 10 Torr. The lower limit temperature is decided according to the vapor pressure of $SF_6$ gas required for setting the discharge gas pressure. It is actually desirable for the control of $SF_6$ gas pressure to select a temperature slightly shifted to the higher temperature side from the curve of $SF_6$ shown in FIG. 7. In case it is not essentially required to attain vertical etching so faithful to the mask dimension as shown in FIG. 5 but a dimensional shift (0.1 μm or less in this case) by a slight undercut is allowable as shown in FIG. 6, it is possible to adopt a temperature region 16 where the upper limit is shifted to the higher temperature side from the curve of $WF_6$. Thus, if the temperature is set at –50° C. or below when, for instance, the $SF_6$ gas pressure is 100 mTorr, the dimensional shift of W can be defined to less than 0.1 μm. In this case, the vapor pressure of reaction product $WF_6$ at –50° C. is 10 Torr, which corresponds to 100 times the etching gas pressure (100 mTorr). Thus, in case the process is set up by allowing the dimensional shift of up to 0.1 μm, it is possible to employ a temperature of up to a level at which the vapor pressure of reaction product becomes about 100 times the etching gas pressure. Also, in case the lower limit temperature was set at –145° C. when the $SF_6$ gas pressure was 100 mTorr, it was found that much time was required for setting of $SF_6$ gas pressure and also RF power must be increased for maintaining the etching speed. Therefore, a slightly higher temperature, or about –140° C., was better suited as the lower limit temperature. Thus, in case a dimensional shift of up to about 0.1 μm is allowable, the temperature region for etching is preferably from –50° C. to –140° C. (when $SF_6$ gas pressure is 100 mTorr), and when the setting of gas pressure is changed, the temperature region 16 of FIG. 7 becomes the available region for attaining good etching. In case the dimensional shift was allowed up to 0.2 μm, the upper limit temperature usable was found to be –5° C., and the vapor pressure of reaction product corresponds to approximately $3 \times 10^3$ times the etching gas pressure. In this case, the available temperature range was from –5° C. to –140° C.

When the temperature was further lowered from the lower temperature side of said temperature region, the etching speed dropped accordingly, and when the temperature was lowered to –150° C. (the gas pressure being 100 mTorr), it became impossible to carry out etching. From the sectional shapes shown in FIGS. 4, 5 and 6, it is seen that the dimensional diminution of the photoresist mask is markedly lessened when the temperature is below –50° C.

Also, vertical etching with a dimensional shift of less than 0.1 μm could be accomplished in the temperature range of –50° C. to –160° C. in case of etching of W with $CF_4$ (100 mTorr), –130° C. to –145° C. in case of etching of Poly Si with 100 mTorr $SF_6$, and –130° C. to –190° C. in case of etching of Poly Si with 100 mTorr $CF_4$. When a dimensional shift of up to 0.2 μm was allowed, the available temperature range turned out be from –5° C. to –160° C. in the case of W etching with $CF_4$, –95° C. to –145° C. in the case of Si etching with $SF_6$, and –95° C. to –190° C. in the case of Si etching with $CF_4$. For etching with gas pressures other than 100 mTorr, it is possible to obtain a good etching pattern by setting a temperature range shifted parallel from the characteristic curves of vapor pressure and temperature shown in FIG. 7.

In the case of Si etching with $SF_6$, when a dimensional shift of up to 0.1 μm was allowed, the desired etching work could be accomplished in said temperature range of –130° C. to –145° C. This corroborates the avilability of temperature of up to a level at which the vapor pressure of reaction product $SiF_4$ becomes a value which corresponds to about 100 times the etching gas pressure. When a dimensional shift of up to 0.2 μm was allowed, it was possible to employ a temperature range where the vapor pressure of reaction product became $10^4$ times or less the working etching gas pressure.

The compound gases containing C, such as $CCl_4$, $C_2Cl_3F_3$, etc., have a strong depositing disposition, so that when using such compound gas as etching gas, vertical etching of Poly Si or Si can be accomplished at an ordinary etching temperature (30°–130° C.) higher than said temperature range owing to the effect of the film deposited on the side. However, in case of using $Cl_2$ gas alone, there takes place an undercut and the dimensional shift is also large, that is, there is seen a tendency similar to that observed when using a gas containing F. In the case of W etching with $Cl_2$ gas, it was impossible with the conventional etching methods to effect etching in the vertical direction since the vapor pressure of the reaction product $WCl_6$ was too low at about +100° C. In Poly Si or Si etching with $Cl_2$ gas, there was obtained a good etching pattern similar to that shown in FIG. 5 at a temperature of –120° C. to –60° C. In this case, too, the etching gas pressure was about 100 mTorr.

The above results indicate that the rate of reaction of article surface and neutral radicals or the reaction product elimination rate is dependent on the article surface temperature. In said temperature range, there was noted almost no difference in etching speed in the vertical direction where the ions enter. It is supported that etching proceeds at a constant speed almost regardless of article temperature and, that the temperature at near of the ion entered surface layer is extremely higher than the temperature of cooled specimen. For example, if it is assumed that the ion energy of 1 eV has suddenly stopped at the surface, the energy of about 10,000 degrees will be dispersed in the neighborhood of the surface to cause a rise of surface temperature. The phenomenon that not only the ions but also the gas molecules adsorbed on the surface effectively participate in the etching reaction as in ion-assisted etching is accounted for by said dispersion of ion energy.

Etching could be performed in a satisfactory way in said temperature range, but it is assumed that if the specimen temperature is further lowered, the vapor pressure of the introduced etching gas will lower excessively to cause deposition on the article surface, and even if ions are applied, the deposit will be only slightly removed and etching of the article itself will not proceed. It is considered that the etching gas deposition rate and the amount of ions applied or the relative quantity of energy decide whether etching is allowed to proceed or not. In any event, a situation where the temperature is lowered to an extreme to let the vapor pressure of etching gas lower excessively is practically undesirable. Therefore, the specimen temperature is set within a range where the vapor pressure of etching gas is maintained at an adequately high level while the vapor pressure of reaction product is lowered.

Etching of Al in accordance with this invention will now be described. The vapor pressure of Al reaction product $AlCl_3$ is lower than those of $WF_6$, etc., and it is below 100 Torr even at 150° C., so that vertical etching should be accomplished with no need of particular cooling. However, when $Cl_2$ plasma etching is conducted on a wafer placed on an ordinary water-cooled specimen stage, there takes place a large undercut, but it was confirmed that such undercut could be reduced when conducting similar etching by adjusting the article temperature to about −50° C.

Since dry etching of Al is an exothermic reaction, it is essentially desirable to regulate the surface temperature of the bottom and side of the grooves or holes formed by etching, but in the ordinary cases, it practically suffices to conduct etching by setting the article temperature to a predetermined level as in the case of etching of silicon or tungsten. That is, etching can be accomplished if the temperature of groove side is sufficiently low to reduce the reaction rate or elimination rate and also the temperature of groove bottom is sufficiently high with the applied ion energy. Since the bottom portion and the side portion are very close to each other in terms of distance, it is advised to enlarge the heat gradient so that the heat given by the application of ions will be able to escape quickly to the rear side after the reaction.

As described above, the present invention provides a novel method for etching an article surface by using active gas plasma, characterized in that etching is carried out by maintaining the article surface temperature so that the vapor pressure of etching gas will become higher than the overall gas pressure in the reaction vessel and that the difference between the vapor pressure of reaction product produced from the reaction of article surface and neutral radicals and the overall gas pressure in the reaction vessel will become smaller than a prescribed value. According to the method of this invention, vertical etching can be accomplished with no need of forming side wall deposit which has been necessary in the conventional vertical etching methods. Further, the dimensional change of resist mask can be markedly reduced in comparison with the conventional methods, so that the etched work is greatly improved in dimensional precision. Moreover, the method of this invention can dispense with the step of removing side wall deposit and can minimize fouling of inner walls of the apparatus. Thus, in accordance with the method of this invention, it becomes possible to accomplish high-precision dry etching faithful to the mask dimensions before etching, to improve the throughput as a result of decrease of contamination and dirt causative of deterioration of element characteristics and reduction of steps, and to decrease the maintenance works such as cleaning of the inside of the apparatus. Further, it is made possible to use the resist materials which have hitherto been considered unusable because of poor dry etching resistance characteristics.

What is claimed is:

1. A dry etching method, comprising the steps of:
providing an article to be etched, including a silicon region having a mask pattern thereon, on a support stage located in a reaction chamber;
producing a plasma of $Cl_2$ gas in said reaction chamber;
lowering the temperature of the article to be etched to a temperature in a range of −60° C. to −120° C., so as to provide the article to have a lowered temperature during the dry etching, including supplying a cooling gas to a back side of said article; and
etching an exposed surface of the article, exposed through the mask pattern, using the plasma,
wherein the step of lowering the temperature includes (1) selectively choosing the temperature at which dry etching is to be performed so as to be a predetermined temperature, said predetermined temperature being determined based upon the material being etched and the etching gas, being within a range which is different for different materials being etched and different etching gases, and being a temperature such that a dimensional shift of the article etched, as compared to a size of the mask pattern, is less than 0.2 μm, and (2) decreasing the temperature of the article to said predetermined temperature.

2. A dry etching method according to claim 1, wherein the etching gas pressure in the reaction chamber, during the etching, is 1–100 mTorr.

3. A dry etching method according to claim 1, wherein said temperature is controlled by using a cooling means and a heater.

4. A dry etching method according to claim 1, wherein a pressure of said cooling gas is above about 1 Torr.

5. A dry etching method according to claim 1, wherein said support stage is electrically insulated from said reaction chamber by an electrical insulator.

6. A dry etching method according to claim 1, wherein a vapor pressure of a reaction product of the etching is at most $10_4$ times a pressure of the etching gas during the etching.

7. A dry etching method, comprising:
providing an article on a support stage in a reaction chamber, said article having a front side and a back side, said front side including a region comprising poly Si or Si and a mask pattern provided over said region;
cooling said support stage to a temperature below 0° C.;
supplying a cooling gas to said back side of said article;
producing a plasma of chlorine gas in said reaction chamber; and
etching said region of said article through said patterned mask using said plasma of said chlorine gas, wherein said article is maintained at a temperature in a range of −120° C. to −60° C. during said etching.

8. A dry etching method according to claim 7, wherein a pressure of said etching gas in said reaction chamber during said etching is 1–100 mTorr.

* * * * *